United States Patent
Cha et al.

(10) Patent No.: US 8,514,650 B2
(45) Date of Patent: Aug. 20, 2013

(54) SEMICONDUCTOR MEMORY DEVICE

(75) Inventors: Jae-Hoon Cha, Gyeonggi-do (KR); Ki-Chon Park, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 239 days.

(21) Appl. No.: 12/914,319

(22) Filed: Oct. 28, 2010

(65) Prior Publication Data

US 2012/0008451 A1    Jan. 12, 2012

(30) Foreign Application Priority Data

Jul. 7, 2010   (KR) .................. 10-2010-0065426

(51) Int. Cl.
*G11C 8/12*  (2006.01)

(52) U.S. Cl.
USPC ........... 365/230.03; 365/193; 365/230.06; 365/205

(58) Field of Classification Search
USPC ............ 365/230.03, 193, 230.06, 205
See application file for complete search history.

(56) References Cited

U.S. PATENT DOCUMENTS

2009/0040860 A1*   2/2009   Baek et al. ............ 365/230.03
2009/0316502 A1*   12/2009  Lee ........................... 365/193

FOREIGN PATENT DOCUMENTS

| JP | 09-185883 | 7/1997 |
|---|---|---|
| KR | 1020090016168 | 2/2009 |
| KR | 1020090126611 | 12/2009 |

OTHER PUBLICATIONS

Notice of Allowance issued by the Korean Intellectual Property Office on May 30, 2012.
Notice of Preliminary Rejection issued from Korean Intellectual Property Office on Oct. 31, 2011.

* cited by examiner

*Primary Examiner* — Toan Le
*Assistant Examiner* — Hai Pham
(74) *Attorney, Agent, or Firm* — IP & T Group LLP

(57) ABSTRACT

A semiconductor memory device includes a first group configured to include a first bank and a second bank; a second group configured to include a third bank and a fourth bank; an address strobe pulse generating unit configured to generate an address strobe pulse signal for activating the first group and the second group in response to a first bank address and a command signal; and a strobe signal generating unit configured to generate a strobe signal that selects a bank from the first group and the second group in response to the address strobe pulse signal and a second bank address.

10 Claims, 11 Drawing Sheets

FIG. 1
(PRIOR ART)

| BANK | ADDRESS | | | | 512M | 1G | 2G |
|---|---|---|---|---|---|---|---|
| | BA3 | BA2 | BA1 | BA0 | 8 BANK | 16 BANK | 16 BANK |
| 0 | 0 | 0 | 0 | 0 | FIRST BANK GROUP | FIRST BANK GROUP | FIRST BANK GROUP |
| 1 | 0 | 0 | 0 | 1 | | | |
| 2 | 0 | 0 | 1 | 0 | SECOND BANK GROUP | | |
| 3 | 0 | 0 | 1 | 1 | | | |
| 4 | 0 | 1 | 0 | 0 | THIRD BANK GROUP | SECOND BANK GROUP | SECOND BANK GROUP |
| 5 | 0 | 1 | 0 | 1 | | | |
| 6 | 0 | 1 | 1 | 0 | FOURTH BANK GROUP | | |
| 7 | 0 | 1 | 1 | 1 | | | |
| 8 | 1 | 0 | 0 | 0 | | THIRD BANK GROUP | THIRD BANK GROUP |
| 9 | 1 | 0 | 0 | 1 | | | |
| 10 | 1 | 0 | 1 | 0 | | | |
| 11 | 1 | 0 | 1 | 1 | | | |
| 12 | 1 | 1 | 0 | 0 | | FOURTH BANK GROUP | FOURTH BANK GROUP |
| 13 | 1 | 1 | 0 | 1 | | | |
| 14 | 1 | 1 | 1 | 0 | | | |
| 15 | 1 | 1 | 1 | 1 | | | |

SEMICONDUCTOR MEMORY DEVICE

CROSS-REFERENCE TO RELATED APPLICATIONS

The present application claims priority of Korean Patent Application No. 10-2010-0065426, filed on Jul. 7, 2010, which is incorporated herein by reference in its entirety.

BACKGROUND OF THE INVENTION

Exemplary embodiments of the present invention relate to semiconductor design technology, and more particularly, to a semiconductor memory for outputting strobe signals.

In general, a semiconductor memory device such as a double data rate synchronous DRAM (DDR SDRAM) generates a strobe signal in response to a column address strobe (CAS) signal (that is, a column command). The strobe signal is a pulse signal having a pulse width corresponding to an external clock signal. Such a strobe signal is used as a source signal in response to which main signals in column access are generated. The strobe signal is often used to generate a column selection signal, a write driver enable signal, and an input/output sense amplifying enable signal. Here, the column selection signal, the write driver enable signal, and the input/output sense amplifying enable signal may have a pulse width corresponding to the strobe signal.

According to an example, tCCD (that is, CAS to CAS Delay, which is a minimum time for accessing another column after accessing one column in the same bank) may be 2 tCK. Thus, the address information ADD is toggled at every 2 tCK. Considering the precharging time of the main/sub local input/output lines LIO and LIOb, the column selection signal YI is set to have a pulse width of 1 tCK. Thus, the strobe signal has the pulse width of 1 tCK. Since a skew may be generated for the address information ADD, the actual window for access of the address information ADD is less than 2 tCK. Therefore, an operation margin in light of such an access window is relatively small.

As a result, next address information ADD may unintentionally interfere when a voltage level difference between the main/sub local input/output lines LIO and LIOb is generated due to the data. Therefore, proper reading of data may be difficult.

Since a cycle of an external clock signal applied to a semiconductor memory device has been decreased to 1 nano second (ns), a pulse width of the strobe signal has also been reduced to 500 pico second (ps) to 1 nano second (ns). Accordingly, a pulse width of the column selection signal YI generated in response to the strobe signal also decreases. Time for generating a sufficient voltage level difference between the main/sub local input/output lines LIO and LIOb is not ensured. When the strobe signal has a relatively small pulse width, it may not swing fully to a desired level as a signal line for the strobe signal often has a large load. Therefore, the operation characteristic of a circuit may be deteriorated and an operation error may occur due to disappearance of the strobe signal.

In order to realize a high speed operation of a semiconductor device, a bank grouping mode to control tCCD as defined in specification has been used.

The bank grouping mode is a mode that groups a plurality of banks and when column access to a same bank of a group repeatedly occurs, tCCD (that is, Column Address Strobe (CAS) to CAS Delay) is extended. The bank grouping mode has been defined in specification to alleviate stress placed on semiconductor memory devices that operate at a speed higher than a certain speed.

More specifically, in a normal mode, tCCD is fixed to 2 tCK based on an external clock signal regardless of grouped banks. Thus, tCCD is 2 tCK for repeated column access to differently grouped banks during the normal mode. tCCD is also 2 tCK for repeated column access to a same group of banks during the normal mode. On the other hand, during the bank grouping mode, tCCD is 2 tCK for repeated column access to differently grouped banks and larger than 2 tCK (for example, 3 tCK or 4 tCK) for repeated column access within in a same bank group.

FIG. 1 is a table illustrating grouping of banks in a bank grouping mode. The table shows bank addresses BA0, BA1, BA2, and BA3, and grouped bank states of a semiconductor memory device having a 512-mega 8-bank structure, a 1-giga 16-bank structure, and a 2-giga 16-bank structure.

Referring to FIG. 1, in case of the semiconductor memory device having the 512-mega 8-bank structure, a 0th bank and a first bank are defined as a first bank group, a second bank and a third bank are defined as a second bank group, a fourth bank and a fifth bank are defined as a third bank group, and a sixth bank and a seventh bank are defined as a fourth bank group.

In case of the semiconductor memory device having the 1-giga 16-bank structure, a 0th bank to a third bank are defined as a first bank group, a fourth bank to a seventh bank are defined as a second bank group, an eighth bank to an eleventh bank are defined as a third bank group, and a twelfth bank to a fifteenth bank are defined as a fourth bank group.

In case of the semiconductor memory device having a 2-giga 16-bank structure, each of four consecutive banks are defined as a first bank group, a second bank group, a third bank group, and a fourth group bank similar to the semiconductor memory device having the 1-giga 16-bank structure.

For illustration purposes, the exemplary embodiments of the present subject matter will be described in reference to a 1-giga 16-bank semiconductor memory device.

For example, in case of a normal mode, if columns in the first bank group are accessed, columns in the first to fourth bank groups are accessed after 2 tCK regardless of which banks. In other words, 2 tCK is required to access a bank in the first to fourth bank groups after accessing another bank in the first to fourth bank groups. Thus, tCCD is always equivalent to 2 tCK regardless of groups of banks.

In case of a bank grouping mode, 4 tCK is required to access a column in a first bank group after a column in the first group are accessed. On the other hand, 2 tCK is required to access a column in any one of the second to fourth bank groups after accessing a column in the first bank group. That is, if columns are repeatedly accessed within a same one of grouped banks, tCCD is 4 tCK. If column access switches to different ones of the grouped banks, tCCD is 2 tCK.

FIGS. 2A and 2B are diagrams illustrating bank access sequence in the bank grouping mode based on specification. FIG. 2A shows a waveform in a normal mode, and FIG. 2B shows a waveform in a bank grouping mode. In FIGS. 2A and 2B, A is a first bank signal, B is a second bank signal, C is a third bank signal, and D is a fourth bank signal.

Referring to FIGS. 2A and 2B, in case of a typical semiconductor memory device, when a column address strobe signal CAS is activated for accessing columns in a corresponding bank, data information (DQ) is applied to an input/output bus (IO BUS).

In case of a normal mode in FIG. 2A, regardless of which one of grouped banks is accessed, the column address strobe signal CAS is applied at 2 tCK based on a cycle of an external clock signal CLK_EXT. Thus, data information corresponding to the first bank group is applied to the input/output but (IO BUS) at an interval of 2 tCK, and data information corresponding to the second to fourth bank groups are also applied to the input/output bus (IO BUS) at an interval of 2 tCK. Thus, data information is toggled at an interval of 2 tCK.

However, in the case of a bank grouping mode of FIG. 2B, the column address strobe signal CAS is applied at an interval of 2 tCK in column access to differently grouped banks. The column address strobe signal CAS is applied at an interval of 4 tCK in repeated column access in a same grouped bank. Thus, if data information corresponding to the first bank group is applied to the input/output bus (IO BUS), subsequent data information corresponding to the second to fourth bank groups can be applied after 2 tCK, and data information corresponding to the same first bank group can be applied after 4 tCK. Operations for the second to fourth bank groups are similar to those described above the first bank group. Here, even when column address strobe signal is toggled at an interval of 4 tCK, data information is toggled at an interval of 2 tCK at the input/output bus (IO BUS). This means that the bank grouping mode and the normal mode have the same input/output bus efficiency.

FIG. 3 is a conventional strobe signal generating device showing banks grouped into 4 groups.

Referring to FIG. 3, when a plurality of banks are grouped into 4 groups, the conventional strobe signal generating device includes a column address strobe pulse generating unit 301, a first strobe signal generating unit 302, a second strobe signal generating unit 303, a third strobe signal generating unit 304 and a fourth strobe signal generating unit 305.

The column address strobe pulse generating unit 301 is configured to receive a column bank signal CBK<2:3>, a column address strobe signal CASP and a bank grouping signal GROUP and output a column address strobe pulse signal CASP8<0:3>.

The first strobe signal generating unit 302 is configured to receive a first column address strobe pulse signal CASP8<0> from the column address strobe pulse generating unit 301 and the column bank signal CBK<0:1> and output first to fourth strobe signals STROBE<0:3> of a first group 306. The second strobe signal generating unit 303 is configured to receive a second column address strobe pulse signal CASP8<1> from the column address strobe pulse generating unit 301 and the column bank signal CBK<0:1> and output fifth to eighth strobe signals STROBE<4:7> of a second group 307.

The third strobe signal generating unit 304 is configured to receive a third column address strobe pulse signal CASP8<2> from the column address strobe pulse generating unit 301 and the column bank signal CBK<0:1> and output ninth to twelfth strobe signals STROBE<8:11> of a third group 308. The fourth strobe signal generating unit 305 is configured to receive a fourth column address strobe pulse signal CASP8<3> from the column address strobe pulse generating unit 301 and the column bank signal CBK<0:1> and output thirteenth to sixteenth strobe signals STROBE<12:15> of a fourth group 309.

The bank grouping signal GROUP is outputted from a mode register set MRS block and is a signal which is enabled during the bank group mode.

That is, when the banks are grouped into 4 groups, 4 column address strobe pulse signals CASP8<0, 1, 2, 3> are inputted into the first to fourth strobe signal generating units 302 to 305, respectively. The number of column address strobe pulse signals is the same as the number of groups.

FIG. 4 is a conventional strobe signal generating device when the banks are grouped into 8 groups.

Referring to FIG. 4, when a plurality of banks are grouped into 8 groups, the conventional strobe signal generating device includes a column address strobe pulse generating unit 401, a first strobe signal generating unit 402, a second strobe signal generating unit 403, a third strobe signal generating unit 404, a fourth strobe signal generating unit 405, a fifth strobe signal generating unit 406, a sixth strobe signal generating unit 407, a seventh strobe signal generating unit 408 and an eighth strobe signal generating unit 409.

The column address strobe pulse generating unit 401 is configured to receive a column bank signal CBK<1:3>, a column address strobe signal CASP and a bank grouping signal GROUP and output a column address strobe pulse signal CASP8<0:8>.

The first strobe signal generating unit 402 is configured to receive a first column address strobe pulse signal CASP8<0> from the column address strobe pulse generating unit 401 and the column bank signal CBK<0> and output first and second strobe signals STROBE<0:1> of a first group 410. The second strobe signal generating unit 403 is configured to receive a second column address strobe pulse signal CASP8<1> from the column address strobe pulse generating unit 401 and the column bank signal CBK<0> and output third and fourth strobe signals STROBE<2:3> of a second group 411.

The third strobe signal generating unit 404 is configured to receive a third column address strobe pulse signal CASP8<2> from the column address strobe pulse generating unit 401 and the column bank signal CBK<0> and output fifth and sixth strobe signals STROBE<4:5> of a third group 412. The fourth strobe signal generating unit 405 is configured to receive a fourth column address strobe pulse signal CASP8<3> from the column address strobe pulse generating unit 401 and the column bank signal CBK<0> and output seventh and eighth strobe signals STROBE<6:7> of a fourth group 413.

The fifth strobe signal generating unit 406 is configured to receive a fifth column address strobe pulse signal CASP8<4> from the column address strobe pulse generating unit 401 and the column bank signal CBK<0> and output ninth and tenth strobe signals STROBE<8:9> of a fifth group 414. The sixth strobe signal generating unit 407 is configured to receive a sixth column address strobe pulse signal CASP8<5> from the column address strobe pulse generating unit 401 and the column bank signal CBK<0> and output eleventh and twelfth strobe signals STROBE<10:11> of a sixth group 415.

The seventh strobe signal generating unit 408 is configured to receive a seventh column address strobe pulse signal CASP8<6> from the column address strobe pulse generating unit 401 and the column bank signal CBK<0> and output thirteenth and fourteenth strobe signals STROBE<12:13> of a seventh group 416. The eighth strobe signal generating unit 409 is configured to receive a eighth column address strobe pulse signal CASP8<7> from the column address strobe pulse generating unit 401 and the column bank signal CBK<0> and output fifteenth and sixteenth strobe signals STROBE<14:15> of a eighth group 417.

That is, when the banks are grouped into 8 groups, 8 column address strobe pulse signals CASP8<0:7> are inputted into the first to eighth strobe signal generating units 402 to 409, respectively. The number of column address strobe pulse signals is the same as the number of groups.

FIG. 5 is a detailed diagram of the column address strobe pulse generating unit shown in FIG. 4.

Referring to FIG. 5, the column address strobe pulse generating unit 401 includes decoder 50 and first to eighth pulse generators 51 to 58.

The decoder 50 is configured to receive 3-bit column bank signal CBK<1:3> and output 8 bank signals BA<0> to BA<7>. Each of the first to eighth pulse generators 51 to 58 is configured to receive the column address strobe signal CASP, the bank grouping signal GROUP and the corresponding bank signal among the 8 bank signals BA<0> to BA<7>, and output the column address strobe pulse signal corresponding to the bank signal among the 8 column address strobe pulse signals CASP8<0> to CASP8<7>.

As described above, when 16 banks are grouped into 4 groups, 4 column address strobe pulse signals is required to output 16 strobe signals. When 16 banks are grouped into 8 groups, 8 column address strobe pulse signals is required to output 16 strobe signals. Therefore, the number of lines connected to each bank of the 8-group case is two times than that of the 4-group case.

SUMMARY OF THE INVENTION

An exemplary embodiment of the present invention is directed to a semiconductor memory device that can increase the number of bank groups without increasing the number of column address strobe pulse signals for generating the strobe signal when the banks is grouped into the plurality of bank groups.

In accordance with an exemplary embodiment of the present invention, a semiconductor memory device includes a first group configured to include a first bank and a second bank, a second group configured to include a third bank and a fourth bank, an address strobe pulse generating unit configured to generate an address strobe pulse signal for activating the first group and the second group in response to a first bank address and a command signal, and a strobe signal generating unit configured to generate a strobe signal that selects a bank from the first group and the second group in response to the address strobe pulse signal and a second bank address.

In accordance with another exemplary embodiment of the present invention, semiconductor memory device includes 2×N bank groups each including N banks, wherein N is a natural number, an address strobe pulse generating unit configured to generate N address strobe pulse signals where two bank groups share a corresponding one of one address strobe pulse signals in response to a first bank address and a command signal, and a strobe signal generating unit configured to generate a strobe signal that selects a bank from the two bank groups sharing the address strobe pulse signal in response to the address strobe pulse signal and a second bank address.

In accordance with yet another exemplary embodiment of the present invention, semiconductor memory device includes a control signal generating block configured to generate a first bank address, a second bank address and a command signal in response to bank information signals, and a signal generating block configured to generates a strobe signal that selects a bank from two bank groups sharing one address strobe pulse signal in response to the first bank address, the second bank address and the command signal.

BRIEF DESCRIPTION OF THE DRAWINGS

FIG. 1 is a table showing banks grouped in a bank grouping mode.

DESCRIPTION OF SPECIFIC EMBODIMENTS

Figure 2A:
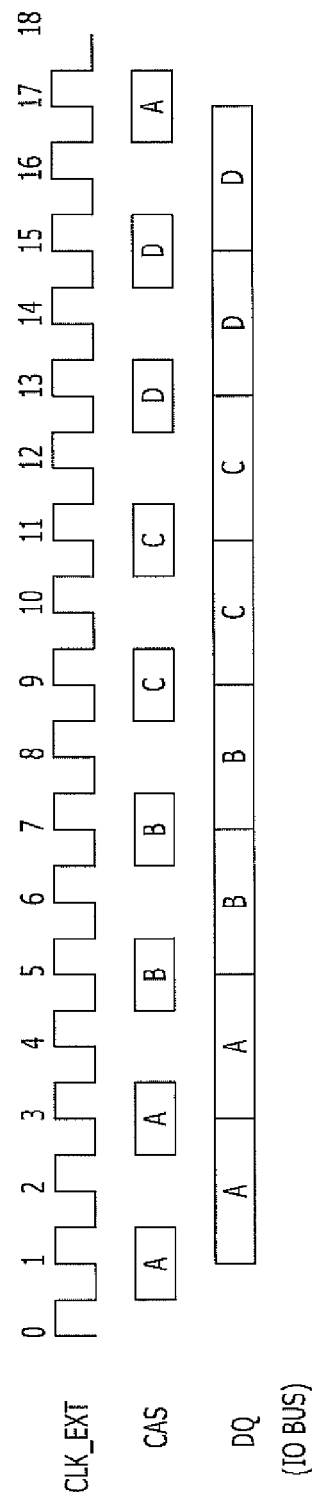
FIGS. 2A and 2B are diagrams illustrating bank access sequence in the bank grouping mode based on a specification.
Figure 2B:
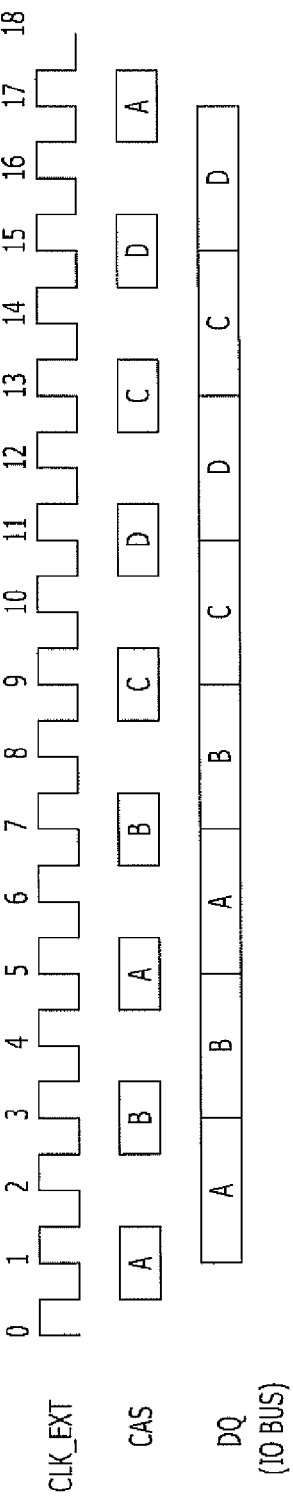
Figure 3:
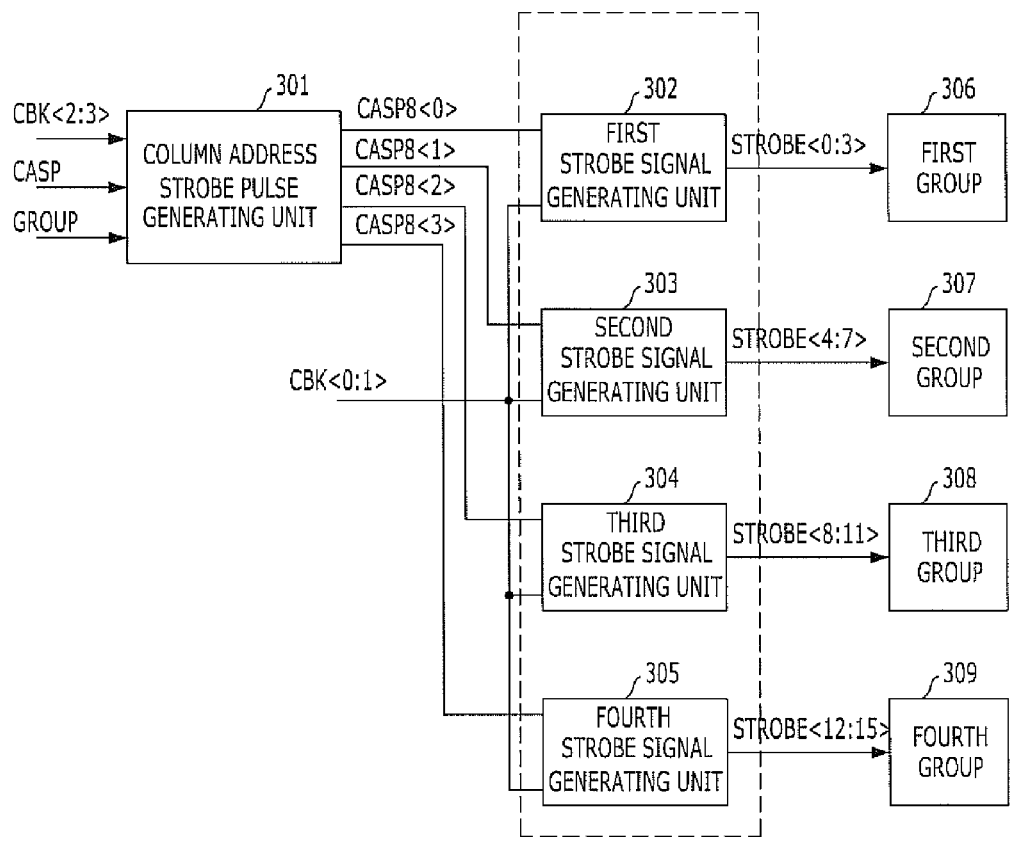
FIG. 3 is a conventional strobe signal generating device where banks are grouped into 4 groups.
Figure 4:
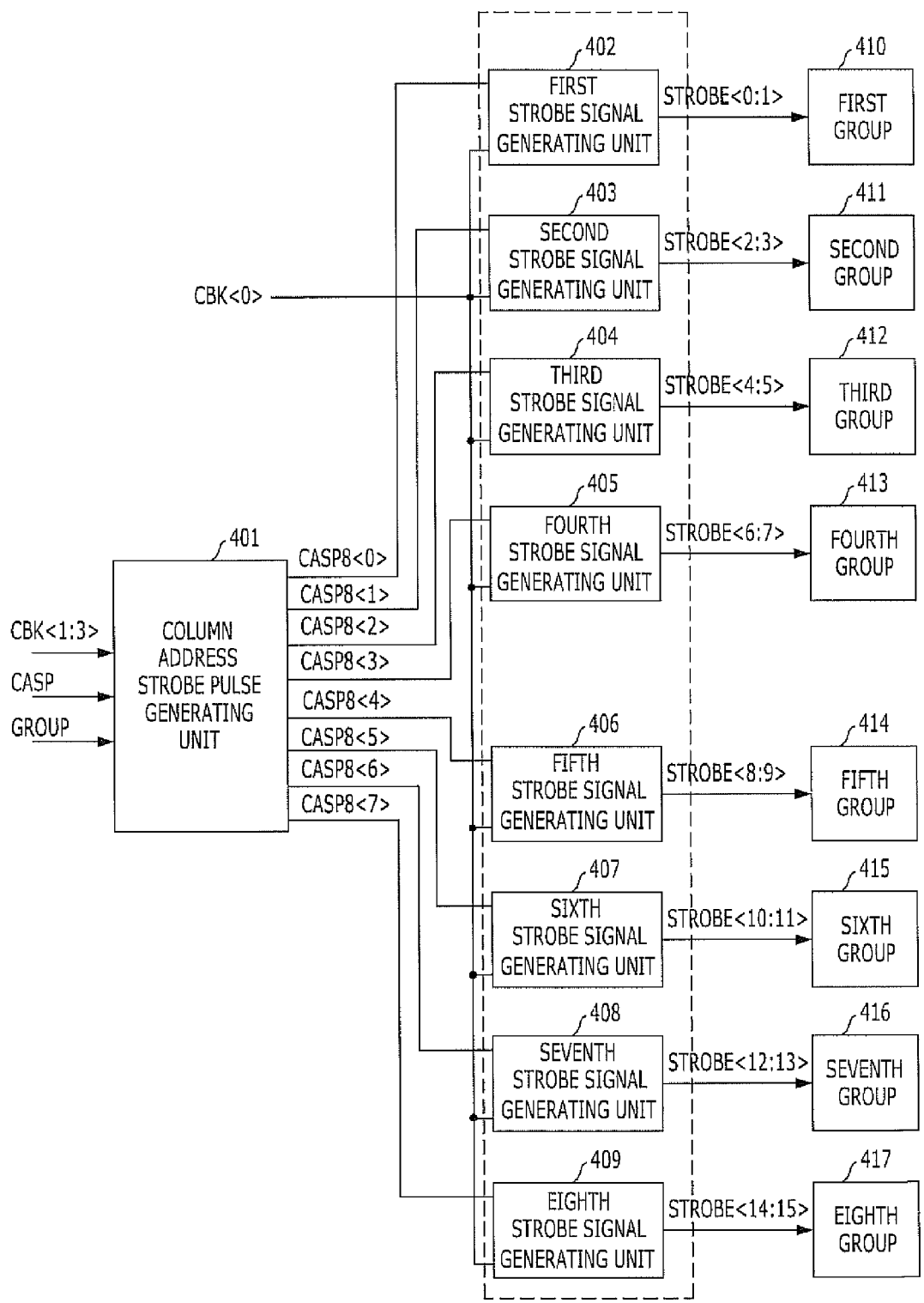
FIG. 4 is a conventional strobe signal generating device where banks are grouped into 8 groups.
Figure 5:
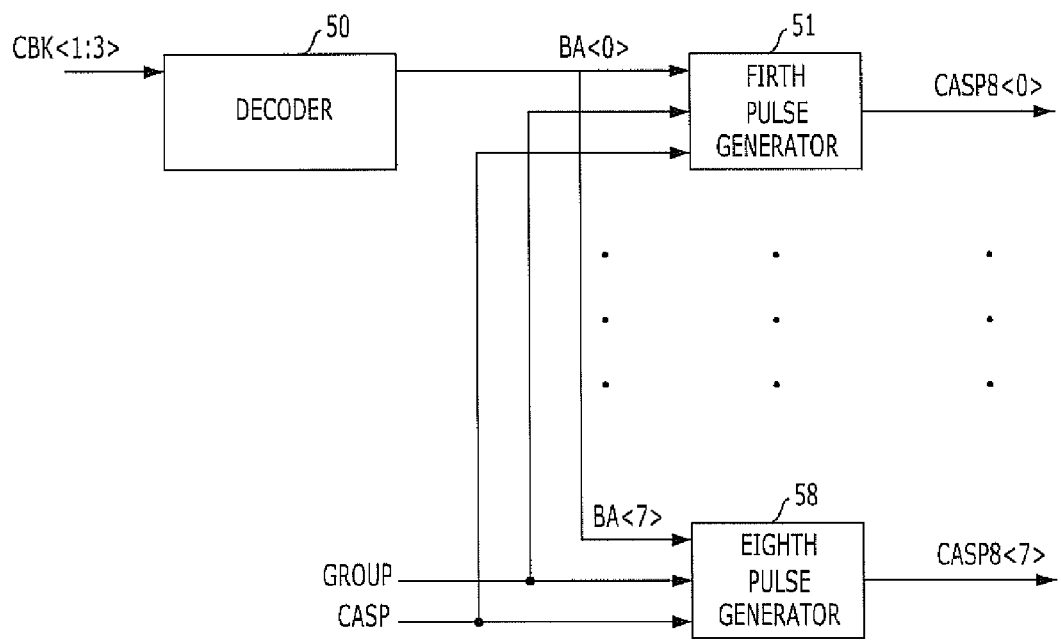
FIG. 5 is a detailed diagram of the column address strobe pulse generating unit shown in FIG. 4.

Exemplary embodiments of the present invention will be described below in more detail with reference to the accompanying drawings. The present invention may, however, be embodied in different forms and should not be construed as being limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 6:
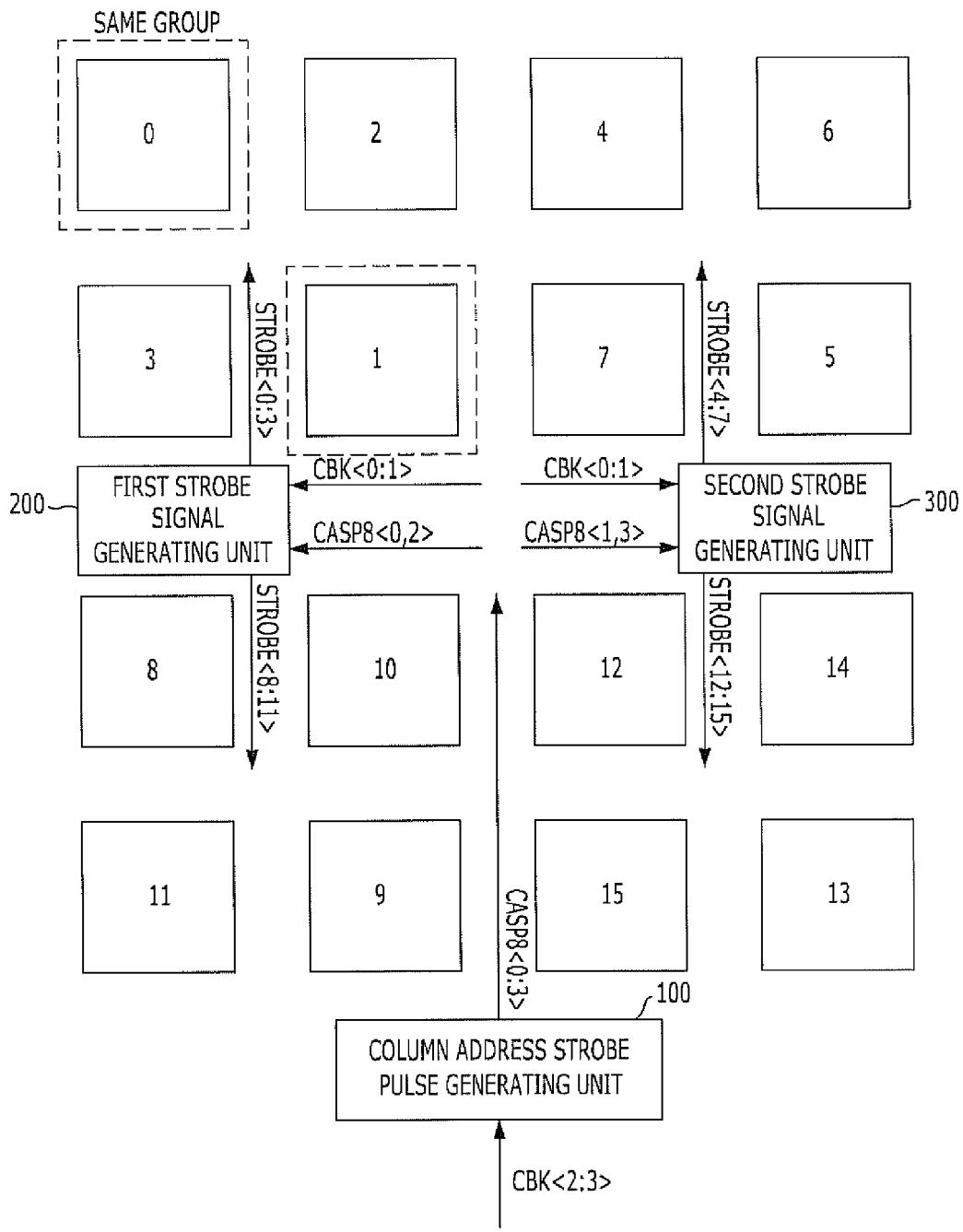
FIG. 6 is a diagram illustrating a strobe signal generating block in accordance with an exemplary embodiment of the present invention.

FIG. 6 is a diagram illustrating a strobe signal generating block in accordance with an exemplary embodiment of the present invention.

Referring to FIG. 6, the location of 16 banks and the locations of the input signals are described. A 0th bank and a first bank are defined as a first bank group, a second bank and a third bank are defined as a second bank group, a fourth bank and a fifth bank are defined as a third bank group, a sixth bank and a seventh bank are defined as a fourth bank group, a eighth bank and a ninth bank are defined as a fifth bank group, a tenth bank and a eleventh bank are defined as a sixth bank group, a twelfth bank and a thirteenth bank are defined as a seventh bank group, and a fourteenth bank and a fifteenth bank are defined as a eighth bank group.

The strobe signal generating block in accordance with an exemplary embodiment of the present invention includes a column address strobe pulse generating unit 100, a first strobe signal generating unit 200 and a second strobe signal generating unit 300.

The column address strobe pulse generating unit 100 is configured to receive a column bank address CBK<2:3> and output first to fourth column address strobe pulse signals CASP8<0, 1, 2, 3>.

The first strobe signal generating unit 200 is configured to receive the first and third column address strobe pulse signals CASP8<0,2> from the column address strobe pulse generating unit 100 and a column bank address CBK<0:1>, and output first to fourth strobe signals STROBE<0:3> and ninth to twelfth strobe signals STROBE<8:11>.

The second strobe signal generating unit 300 is configured to receive the second and fourth column address strobe pulse signals CASP8<1,3> from the column address strobe pulse generating unit 100 and a column bank address CBK<0:1>, and output fifth to eighth strobe signals STROBE<4:7> and thirteenth to sixteenth strobe signals STROBE<12:15>.

In terms of physical Location, when the column address strobe pulse signals CASP8<0:3> are inputted, the first and third column address strobe pulse signals CASP8<0,2> are inputted to a left 8-bank region including the first bank group ($0^{th}$ and first banks), the second bank group (second and third banks), the fifth bank group (eighth and ninth banks) and the sixth bank group (tenth and eleventh banks). Also, the second and fourth column address strobe pulse signals CASP8<1,3> are inputted to a right 8-bank region including the third bank group (fourth and fifth banks), the fourth bank group (sixth and seventh banks), the seventh bank group (twelfth and thirteenth banks) and the eighth bank group (fourteenth and fifteenth banks).

In the left 8-bank region, the first to fourth strobe signals STROBE<0:3> and the ninth to twelfth strobe signals STROBE<8:11> are generated by combining the first and third column address strobe pulse signals CASP8<0,2> and the column bank address CBK<0:1>. The first to fourth strobe signals STROBE<0:3> are inputted into a left upper 4-bank region including the first bank group and the second bank group, and the ninth to twelfth strobe signals STROBE<8:11> are inputted into a left lower 4-bank region including the fifth bank group and the sixth bank group.

In the right 8-bank region, the fifth to eighth strobe signals STROBE<4:7> and the thirteenth to sixteenth strobe signals STROBE<12:15> are generated by combining the second and fourth column address strobe pulse signals CASP8<1,3> and the column bank address CBK<0:1>. The eighth strobe signals STROBE<4:7> are inputted into a right upper 4-bank region including the third bank group and the fourth bank group, and the thirteenth to sixteenth strobe signals STROBE<12:15> are inputted into a right lower 4-bank region including the seventh bank group and the eighth bank group.

In the present invention, two bank groups share one column address strobe pulse signal, and thus, 16 strobe signals corresponding to 16 banks that groups into 8 groups may be generated by using 4 column address strobe pulse signals CASP8<0:3>.

Figure 7:
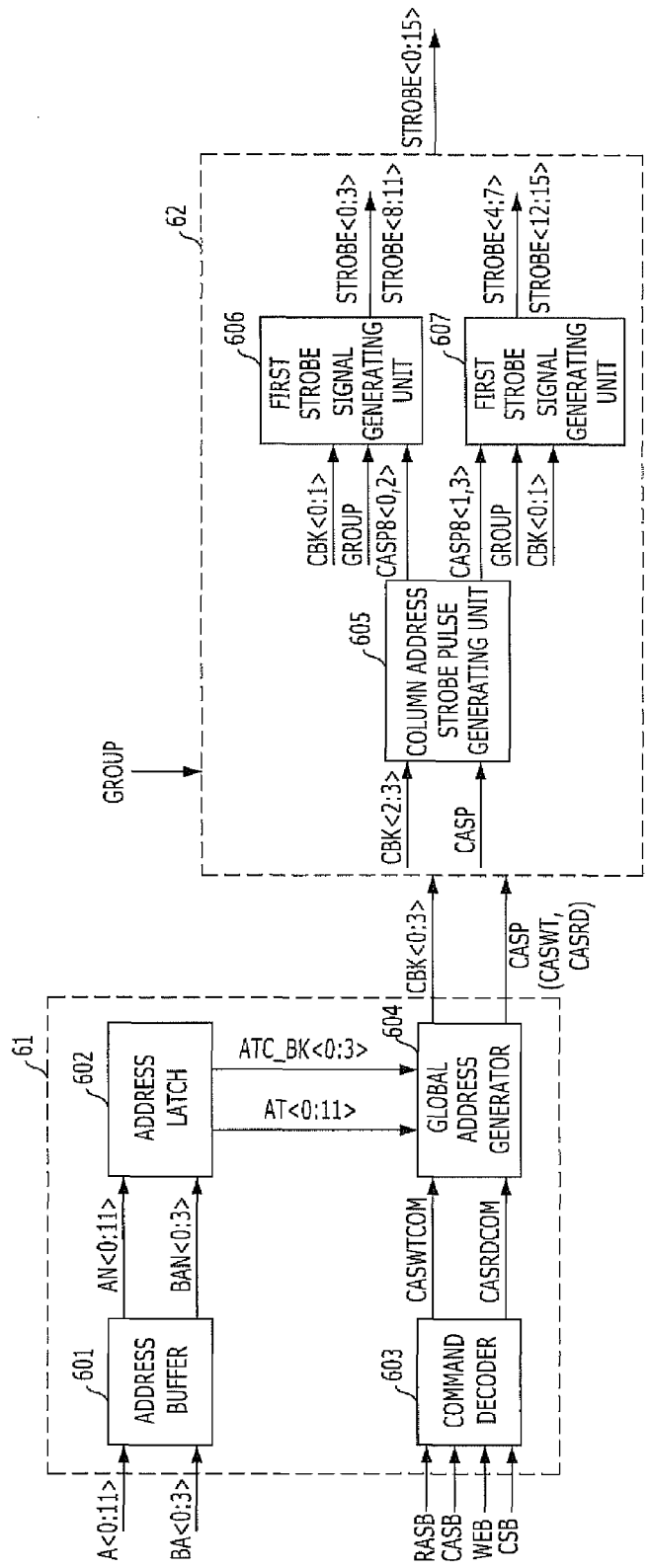
FIG. 7 is a semiconductor memory device including a strobe signal generating block in accordance with an exemplary embodiment of the present invention.

FIG. 7 is a semiconductor memory device including a strobe signal generating block in accordance with an exemplary embodiment of the present invention.

Referring to FIG. 7, the semiconductor memory device includes a control signal generating block 61 and the strobe signal generating block 62.

The control signal generating block 61 is configured to receive a normal address A<0:11>, a bank address BA<0:3> and command signals (RASB, CASB, WEB, and CSB), and output a column bank address CBK<0:3> and a column address strobe signal (CASP, CASWT or CASRD). The strobe signal generating block 62 is configured to receive the column bank address CBK<0:3>, the column address strobe signal (CASWT, CASRD) and bank grouping signal GROUP and generate the first to sixteenth strobe signals STROBE<0:15>. Hereinafter, in the column bank address CBK<0:3>, CBK<2:3> is defined as a first column bank address and CBK<0:1> is defined as a second column bank address.

The control signal generating block 61 includes an address buffer 601, an address latch 602, a command decoder 603 and a global address generator 604.

The address buffer 601 is configured to receive the normal address A<0:11> and the bank address BA<0:3>, buffer them and output a buffed normal address AN<0:11> and a buffered bank address BAN<0:3>. The address latch 602 is configured receive the buffered normal address AN<0:11> and the buffered bank address BAN<0:3>, latch them and output a latched normal address AT<0:11> and a latched bank address ATC_BK<0:3>.

The command decoder 603 is configured to decode external control signals (RASB, CASB, WEB and CSB) and output a command signals (CASWTCOM and CASRDCOM). The global address generator 604 is configured to receive the command signals (CASWTCOM and CASRDCOM), the latched normal address AT<0:11> and the latched bank address ATC_BK<0:3> and output the column bank address CBK<0:3> and the column address strobe signal CASP.

The strobe signal generating block 62 includes a column address strobe pulse generating unit 605, a first strobe signal generating unit 606 and a second strobe signal generating unit 607.

The column address strobe pulse generating unit 605 is configured to receive the first column bank address and CBK<2:3> and the column address strobe signal CASP and output column address strobe pulse signals CASP8<0, 1, 2, 3>.

The first strobe signal generating unit 606 is configured to receive the column address strobe pulse signal CASP8<0,2> from the column address strobe pulse generating unit 605, the second column bank address CBK<0:1> and the bank grouping signal GROUP, and output the first to fourth strobe signals STROBE<0:3> and the ninth to twelfth strobe signals STROBE<8:11>.

The second strobe signal generating unit 607 is configured to receive the column address strobe pulse signal CASP8<1, 3> from the column address strobe pulse generating unit 605, the second column bank address CBK<0:1> and the bank grouping signal GROUP, and output the fifth to eighth strobe signals STROBE<4:7> and the thirteenth to sixteenth strobe signals STROBE<12:15>.

The first strobe signal generating unit 606 and the second strobe signal generating unit 607 additionally receive the bank grouping signal GROUP in order to expand the pulse width of the strobe signals. Here, the bank grouping signal GROUP is used to expand the pulse width of the strobe signals.

Figure 8:
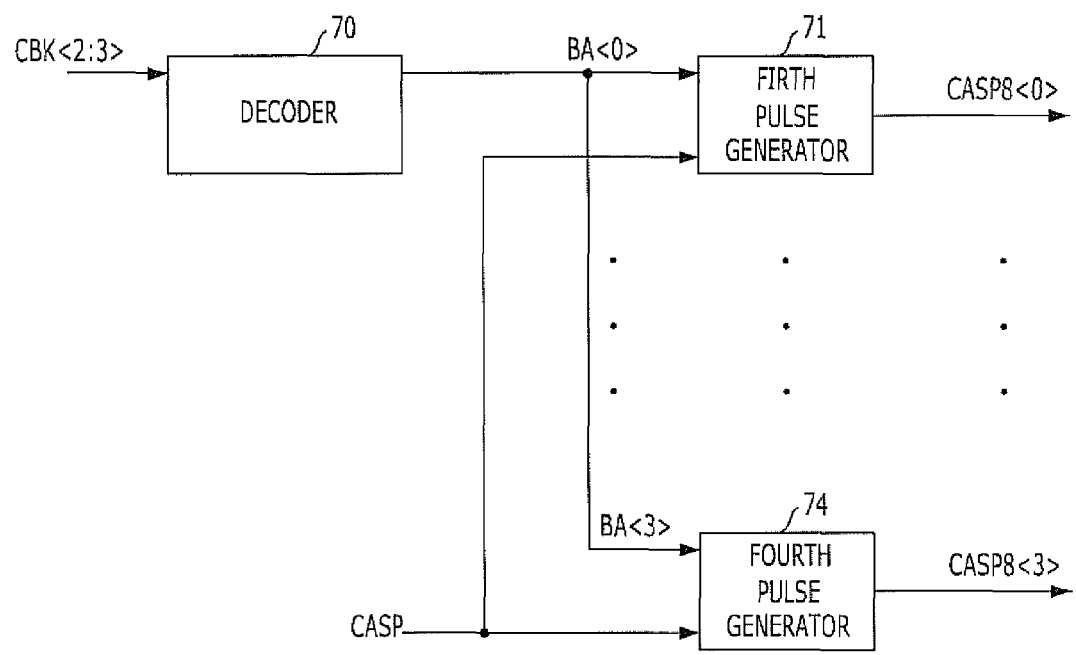
FIG. 8 is a detailed diagram of the column address strobe pulse generating unit shown in FIG. 7.

FIG. 8 is a detailed diagram of the column address strobe pulse generating unit shown in FIG. 7.

Referring to FIG. 8, the column address strobe pulse generating unit 605 includes decoder 70 and first to fourth pulse generators 71 to 74.

The decoder 70 is configured to receive the 2-bit first column bank address CBK<2:3> and output 4 bank signals BA<0> to BA<3>. Each of the first to fourth pulse generators 71 to 74 is configured to receive the column address strobe signal CASP and the corresponding bank signal among the 4 bank signals BA<0> to BA<3>, and output the column address strobe pulse signal corresponding to the bank signal among the 4 column address strobe pulse signals CASP8<0> to CASP8<3>.

In other words, the column address strobe pulse generating unit 605 decodes the first column bank address CBK<2:3> and generates the first column address strobe pulse signal CASP<0> corresponding to the 0th to the third banks, the second column address strobe pulse signal CASP<1> corresponding to the fourth to the seventh banks, the third column address strobe pulse signal CASP<2> corresponding to the eighth to the eleventh banks, and the fourth column address strobe pulse signal CASP<3> corresponding to the twelfth bank to the fifteenth bank.

Figure 9:
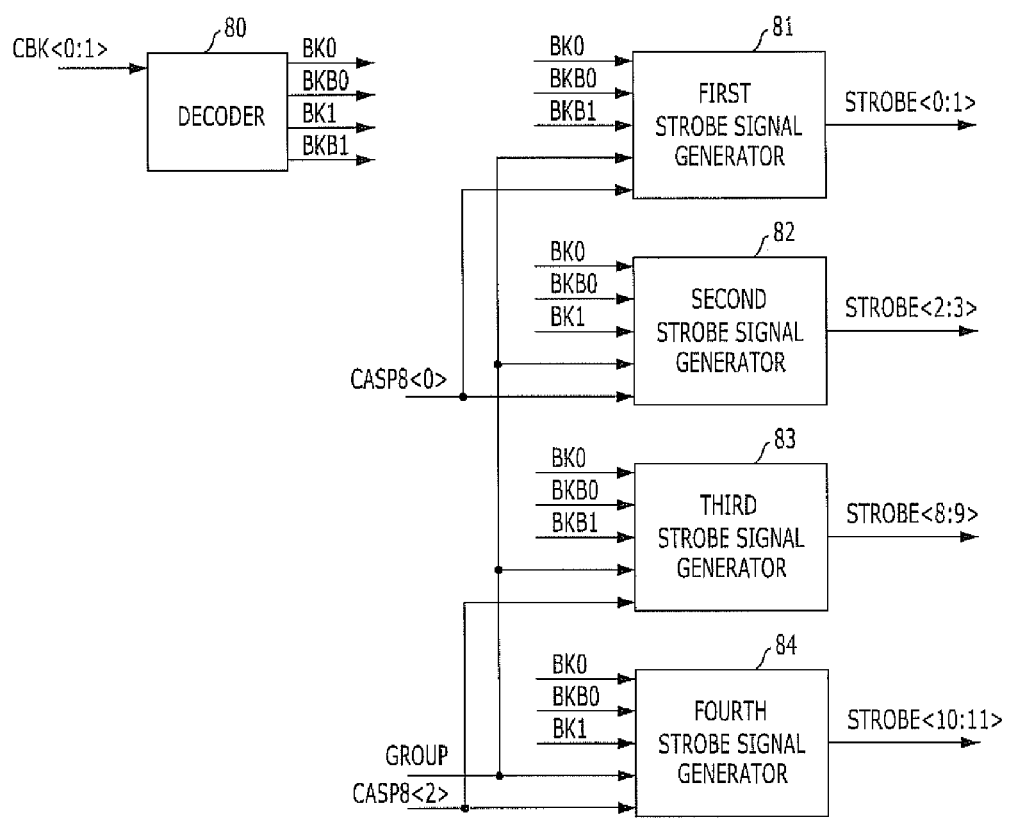
FIG. 9 is a detailed diagram of the first strobe signal generating unit shown in FIG. 7.

FIG. 9 is a detailed diagram of the first strobe signal generating unit shown in FIG. 7.

Referring to FIG. 9, the first strobe signal generating unit 606 includes a decoder 80, a first strobe signal generator 81, a second strobe signal generator 82, a third strobe signal generator 83 and a fourth strobe signal generator 84.

The decoder 80 is configured to decode the second column bank address CBK<0:1> and output a first to fourth signals (BK0, BKB0, BK1 and BKB1).

The first strobe signal generator 81 is configured to receive the first column address strobe pulse signal CASP8<0>, the bank grouping signal GROUP and the first, second and fourth signals (BK0, BKB0 and BKB1) and generate the first and second strobe signals STROBE<0:1>. The second strobe signal generator 82 is configured to receive the first column address strobe pulse signal CASP8<0>, the bank grouping signal GROUP and the first to third signals (BK0, BKB0 and BK1) and generate the third and fourth strobe signals STROBE<2:3>.

The third strobe signal generator 83 is configured to receive the third column address strobe pulse signal CASP8<2>, the bank grouping signal GROUP and the first, second and fourth signals (BK0, BKB0 and BKB1) and generate the ninth and tenth strobe signals STROBE<8:9>. The fourth strobe signal generator 84 is configured to receive the third column address strobe pulse signal CASP8<2>, the bank grouping signal GROUP and the first to third signals (BK0, BKB0 and BK1) and generate the eleventh and twelfth strobe signals STROBE<10:11>.

The second strobe signal generating unit 607 has the same structure and operations with the first strobe signal generating unit 606 except for having different input/output data.

Thus, the second strobe signal generating unit 607 includes a decoder, a fifth strobe signal generator, a sixth strobe signal generator, a seventh strobe signal generator and an eighth strobe signal generator which correspond to first to fourth strobe signal generators of the first strobe signal generating unit 606.

The decoder is configured to decode the second column bank address CBK<0:1> and output the first to fourth signals (BK0, BKB0, BK1 and BKB1).

The fifth strobe signal generator is configured to receive the second column address strobe pulse signal CASP8<1>, the bank grouping signal GROUP and the first, second and fourth signals (BK0, BKB0 and BKB1) and generate the fifth and sixth strobe signals STROBE<4:5>. The sixth strobe signal generator is configured to receive the second column address strobe pulse signal CASP8<1>, the bank grouping signal GROUP and the first to third signals (BK0, BKB0 and BK1) and generate the seventh and eighth strobe signals STROBE<6:7>.

The seventh strobe signal generator is configured to receive the fourth column address strobe pulse signal CASP8<3>, the bank grouping signal GROUP and the first, second and fourth signals (BK0, BKB0 and BKB1) and generate the thirteenth and fourteenth strobe signals STROBE<12:13>. The eighth strobe signal generator is configured to receive the fourth column address strobe pulse signal CASP8<3>, the bank grouping signal GROUP and the first to third signals (BK0, BKB0 and BK1) and generate the fifteenth and sixteenth strobe signals STROBE<14:15>.

The second signal BKB0 is an inverse signal of the first signal BK0, and the fourth signal BKB1 is an inverse signal of the third signal BK1.

The second strobe signal generating unit 607 may have an individual decoder. Alternatively, the second strobe signal generating unit 607 may share the decoder 80 of the first strobe signal generating unit 606.

Figure 10:
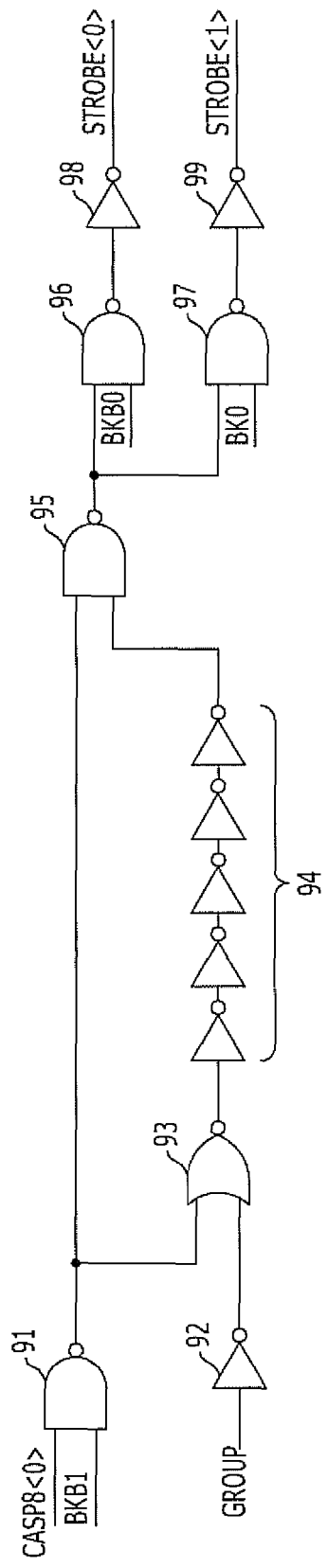
FIG. 10 is a detailed diagram of the first strobe signal generator shown in FIG. 9.

FIG. 10 is a detailed diagram of the first strobe signal generator shown in FIG. 9.

Referring to FIG. 10, the first strobe signal generator 81 includes a first NAND gate 91, a first inverter 92, a first NOR gate 93, a delay unit 94, a second NAND gate 95, a third NAND gate 96, a fourth NAND gate 97, a second inverter 98 and a third inverter 99.

The first NAND gate 91 receives the column address strobe signal CASP and the fourth signal BKB1 and performs NAND operation of the column address strobe signal CASP and the fourth signal BKB1. The first inverter 92 inverts the bank grouping signal GROUP and outputs the inverted bank grouping signal. The first NOR gate 93 receives the output of the first NAND gate 91 and the output of the first inverter 92, the inverted bank grouping signal, and performs NOR operation.

The delay unit 94 receives the output of the first NOR gate 93 and delays a desired delay amount. The second NAND gate 95 receives the output of the first NAND gate 91 and the output of the delay unit 94 and performs the NAND operation.

The third NAND gate 96 receives the output of the second NAND gate 95 and the second signal BKB0 and performs the NAND operation. The fourth NAND gate 97 receives the output of the second NAND gate 95 and the first signal BK0 and performs the NAND operation. The second inverter 98 inverts the output of the third NAND gate 96 and outputs the first strobe signal STROBE<0>. The third inverter 99 inverts the output of the fourth NAND gate 97 and outputs the second strobe signal STROBE<1>.

The delay unit 94 includes a plurality of inverters.

The third, fifth and seventh strobe signal generators have the same structure and operations to those of the first strobe signal generator 81. Here, a first output strobe signal is the first strobe signal of the corresponding bank, and a second output strobe signal is the second strobe signal of the corresponding bank. Otherwise, the detailed description of the other strobe signal generators will be omitted.

The second strobe signal generator 82 has the same structure and operations with the first strobe signal generator 81 except that the third signal BK1 is used instead of the fourth signal BKB1.

The fourth, sixth and eighth strobe signal generators have the same structure and operations with the second strobe signal generator 82. Also, a first output strobe signal is the first strobe signal of a corresponding bank, and a second output strobe signal is the second strobe signal of a corresponding bank. Otherwise, the detailed description of the other strobe signal generators will be omitted.

The column address strobe pulse signals CASP8<0, 1, 2, 3> outputted from the column address strobe pulse generating unit 605 have the same pulse widths regardless of the bank group. Since the pulse widths of the column address strobe pulse signals CASP8<0, 1, 2, 3> are not changed, outputting or isolating eight signals for 8-group is not needed. The expansion of the pulse widths is performed in the first strobe signal generating unit 606 and the second strobe signal generating unit 607 by using the bank grouping signal GROUP. The pulse width expansion of the strobe signals is performed in the first strobe signal generator 81 to the fourth strobe signal generator 84 (See FIG. 9). More particularly, the delay unit 94 in FIG. 10 is used to expand the pulse width of the strobe signal.

That is, 16 strobe signals may be generated by using four column address strobe pulse signals CASP8<0:3>.

Since the strobe signals in the same bank group may use tCCD larger than 2 tCK according to specification, the first to fourth strobe signal generators 81 to 84 may be shared. However, as to other bank groups, the strobe signals for the other bank groups are to maintain tCCD of 2 tCK and thus, the first to fifth strobe signal generators 81 to 84 may not be shared.

Figure 11:
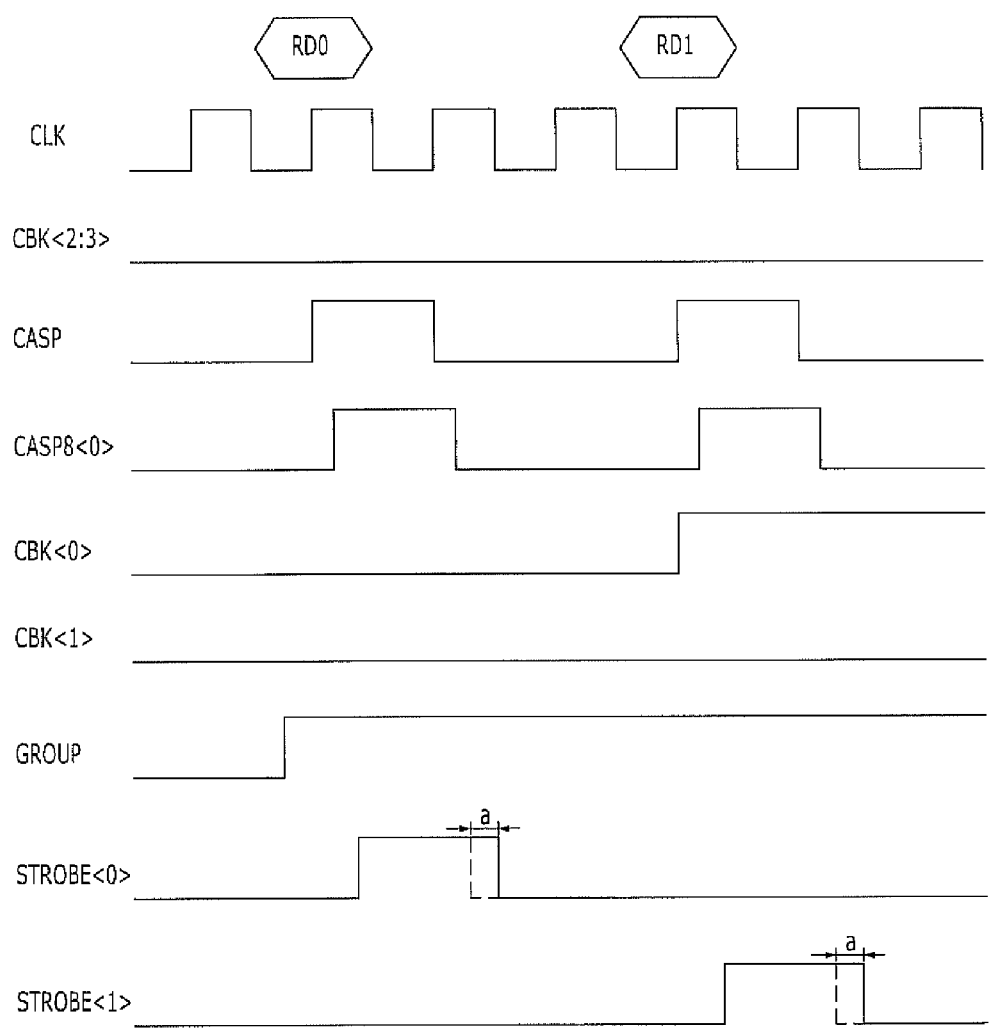
FIG. 11 illustrates waveforms of a semiconductor memory device in accordance with an exemplary embodiment of the present invention.

FIG. 11 illustrates waveforms of a semiconductor memory device in accordance with an exemplary embodiment of the present invention. For example, the strobe signals of the first bank group are presented.

Referring to FIG. 11, a clock signal CLK is inputted and the bank grouping signal GROUP is activated. When the first column bank address CBK<2:3> have all logical 'low' state, it represents that the strobe signals are outputted to the 0th to the third banks. Then, the column address strobe signal CASP is activated (that is, transition from a logical 'low' state to a logical 'high' state), and the column address strobe pulse signal CASP8<0> is activated to a logical 'high' state. When CBK<1> is a logical 'low' state and CBK<0> is a logical 'low' state, the first strobe signal STROBE<0> is outputted. Also, when CBK<1> is a logical 'low' state and CBK<0> is a logical 'high' state, the second strobe signal STROBE<1> is outputted.

Here, the pulse widths of the first strobe signal STROBE<0> and the second strobe signal STROBE<1> are expanded by 'a' due to the bank grouping signal GROUP.

In accordance with the exemplary embodiments of the present invention, a plurality of bank groups share a column address strobe pulse signal. Therefore, when the banks are grouped into the plurality of bank groups, the number of bank groups may be increased without increasing the number of the column address strobe pulse signals for generating the strobe signal by sharing.

While the present invention has been described with respect to the specific exemplary embodiments, it will be apparent to those skilled in the art that various changes and modifications may be made without departing from the spirit and scope of the invention as defined by the following claims.

What is claimed is:

1. A semiconductor memory device comprising:
   a first bank group configured to include a first bank and a second bank;
   a second bank group configured to include a third bank and a fourth bank;
   an address strobe pulse generating unit configured to generate an address strobe pulse signal for activating the first bank group and the second bank group in response to a first bank address and a command signal; and
   a strobe signal generating unit configured to generate a strobe signal that selects a bank from the first bank group and the second bank group in response to the address strobe pulse signal and a second bank address,
   wherein the address strobe pulse signal is shared by the first bank group and the second bank group,
   wherein the strobe signal generating unit comprises:
      a decoder configured to decode the second bank address into a bank signal;
      a first strobe signal generator configured to generate a first strobe signal or a second strobe signal in response to the address strobe pulse signal, a bank grouping signal and the bank signal, and output the first strobe signal or the second strobe signal to a corresponding bank of the first bank group; and
      a second strobe signal generator configured to generate a third strobe signal or a fourth strobe signal in response to the address strobe pulse signal, the bank grouping signal and the bank signal, and output the third strobe signal or the fourth strobe signal to a corresponding bank of the second bank group.

2. The semiconductor memory device of claim 1, wherein the strobe signal generating unit further receives the bank grouping signal as an input signal to expand a pulse width of the strobe signal.

3. The semiconductor memory device of claim 1, wherein the first strobe signal generator includes a delay unit configured to delay a signal in response to the bank grouping signal.

4. The semiconductor memory device of claim 3, wherein the first strobe signal generator further includes a NAND gate to perform a NAND operation on an output of the delay unit and a logical combination of the bank signal and the address strobe pulse signal.

5. A semiconductor memory device comprising:
   2N-bank groups each including a plurality of banks, wherein N is a natural number;
   an address strobe pulse generating unit configured to generate N address strobe pulse signals where two bank groups share a corresponding one of the address strobe pulse signals in response to a first bank address and a command signal; and
   a strobe signal generating unit configured to generate a strobe signal that selects a bank from the two bank groups sharing the address strobe pulse signal in response to the address strobe pulse signal and a second bank address,
   wherein the strobe signal generating unit comprises N strobe signal generators each configured to generate a strobe signal that selects a bank from the corresponding two bank groups sharing the corresponding address strobe pulse signal in response to the corresponding address strobe pulse signal, the second bank address and a bank grouping signal,
   wherein each of N strobe signal generators comprises:
      a first decoder configured to decode the second bank address into a bank signal;
      a first strobe signal generator configured to generate a first strobe signal or a second strobe signal in response to the address strobe pulse signal, the bank grouping signal and the bank signal, and output the first strobe signal or the second strobe signal to a corresponding bank of the first bank group; and
      a second strobe signal generator configured to generate a third strobe signal or a fourth strobe signal in response to the address strobe pulse signal, the bank grouping signal and the bank signal, and output the third strobe signal or the fourth strobe signal to a corresponding bank of the second bank group.

6. The semiconductor memory device of claim 5, wherein the address strobe pulse generating unit comprises:
   a second decoder configured to decode the first bank address into N bank signals; and
   a pulse generator configured to generate the N address strobe pulse signals in response to the N bank signals and the command signal.

7. The semiconductor memory device of claim 5, wherein the strobe signal generating unit is further configured to receive the bank grouping signal as an input signal to expand a pulse width of the strobe signal.

8. A semiconductor memory device comprising:
   a control signal generating block configured to generate a first bank address, a second bank address and a command signal in response to bank information signals; and
   a signal generating block configured to generate a strobe signal that selects a bank from two bank groups sharing one address strobe pulse signal in response to the first bank address, the second bank address and the command signal, wherein the signal generating block comprises:

an address strobe pulse generating unit configured to generate address strobe pulse signal sharing the two bank groups in response to the first bank address and the command signal; and a strobe signal generating unit configured to generate the strobe signal that selects a bank from the two bank groups sharing the address strobe pulse signal in response to the address strobe pulse signal and the second bank address, wherein the strobe signal generating unit comprises:

a first decoder configured to decode the second bank address into a bank signal;

a first strobe signal generator configured to generate a first strobe signal or a second strobe signal in response to the address strobe pulse signal, a bank grouping signal and the bank signal, and output the first strobe signal or the second strobe signal to a corresponding bank of the first bank group; and a second strobe signal generator configured to generate a third strobe signal or a fourth strobe signal in response to the address strobe pulse signal, the bank grouping signal and the bank signal, and output the third strobe signal or the fourth strobe signal to a corresponding bank of the second bank group.

9. The semiconductor memory device of claim 8, wherein the address strobe pulse generating unit comprises:

a second decoder configured to decode the first bank address into a bank signal; and a pulse generator configured to generate the address strobe pulse signal sharing the two bank groups in response to the bank signal and the command signal.

10. The semiconductor memory device of claim 8, wherein the strobe signal generating unit is further configured to receive the bank grouping signal as an input signal to expand a pulse width of the strobe signal.

* * * * *